US009496528B2

(12) United States Patent
Lee et al.

(10) Patent No.: US 9,496,528 B2
(45) Date of Patent: Nov. 15, 2016

(54) METHOD OF MANUFACTURING ORGANIC LIGHT-EMITTING DISPLAY APPARATUS

(71) Applicant: SAMSUNG DISPLAY CO., LTD., Yongin, Gyeonggi-Do (KR)

(72) Inventors: Donghoon Lee, Yongin (KR); Joonhyung Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/684,847

(22) Filed: Apr. 13, 2015

(65) Prior Publication Data

US 2016/0126506 A1 May 5, 2016

(30) Foreign Application Priority Data

Oct. 29, 2014 (KR) .................. 10-2014-0148438

(51) Int. Cl.
*H01L 51/56* (2006.01)
*H01L 27/32* (2006.01)
*H01L 21/00* (2006.01)
*H01L 51/52* (2006.01)

(52) U.S. Cl.
CPC .......... *H01L 51/56* (2013.01); *H01L 27/3246* (2013.01); *H01L 27/3258* (2013.01); *H01L 51/5206* (2013.01); *H01L 51/5221* (2013.01); *H01L 2227/323* (2013.01)

(58) Field of Classification Search
CPC ............ H01L 51/5221; H01L 27/3246; H01L 27/3258; H01L 2227/323
USPC .................................. 438/23, 473
See application file for complete search history.

(56) References Cited

U.S. PATENT DOCUMENTS

| 2004/0201874 | A1 | 10/2004 | Yamazaki | |
| 2006/0199476 | A1* | 9/2006 | Cok | B23K 26/1464 451/38 |
| 2007/0048886 | A1* | 3/2007 | Winters | H01L 51/56 438/29 |
| 2007/0169806 | A1* | 7/2007 | Fork | H01L 31/022425 136/256 |

FOREIGN PATENT DOCUMENTS

| JP | 2007-094122 | 4/2007 |
| KR | 10-2011-0037073 A | 4/2011 |
| KR | 10-2012-0106402 A | 9/2012 |
| KR | 10-2013-0042894 A | 4/2013 |

* cited by examiner

*Primary Examiner* — Moazzam Hossain
*Assistant Examiner* — Omar Mojaddedi
(74) *Attorney, Agent, or Firm* — Lee & Morse, P.C.

(57) ABSTRACT

A method of manufacturing an organic light-emitting display apparatus includes forming a pixel electrode, a bus electrode and a pixel defining layer on a same layer on a substrate, the pixel defining layer exposing a center of the pixel electrode and a portion of the bus electrode, forming an intermediate layer on the pixel-defining layer and on the pixel electrode and the bus electrode, orienting the substrate such that the intermediate layer is located underneath the substrate, forming an opening in the intermediate layer by irradiating the intermediate layer with a laser beam from underneath the intermediate layer to remove the intermediate layer on the bus electrode, exposing at least a portion of the bus electrode, and forming an opposite electrode such that the opposite electrode contacts the bus electrode via the opening in the intermediate layer.

17 Claims, 6 Drawing Sheets

METHOD OF MANUFACTURING ORGANIC LIGHT-EMITTING DISPLAY APPARATUS

CROSS-REFERENCE TO RELATED APPLICATION

Korean Patent Application No. 10-2014-0148438, filed on Oct. 29, 2014, in the Korean Intellectual Property Office, and entitled: "Method of Manufacturing Organic Light-Emitting Display Apparatus," is incorporated by reference herein in its entirety.

BACKGROUND

1. Field

Embodiments relate to a method of manufacturing an organic light-emitting display apparatus.

2. Description of the Related Art

An organic light-emitting display apparatus includes a plurality of pixels, each pixel being an organic light-emitting device. The organic light-emitting device includes pixel electrodes, an opposite electrode which faces the pixel electrodes, and an intermediate layer that is arranged between the pixel electrodes and the opposite electrode and includes an emission layer. The pixel electrodes may have an island shape in which pixels are respectively patterned, and the opposite electrode may be integrally formed on the pixels.

SUMMARY

Embodiments are directed to a method of manufacturing an organic light-emitting display apparatus including forming a pixel electrode and a bus electrode on a same layer on a substrate, the pixel electrode and the bus electrode being spaced apart and electrically insulated from each other, forming a pixel-defining layer on the same layer and on the pixel electrode and the bus electrode such that at least a portion of the pixel electrode including a center of the pixel electrode and at least a portion of the bus electrode are exposed, forming an intermediate layer on an upper surface of the pixel-defining layer disposed between the pixel electrode and the bus electrode, and on the pixel electrode and the bus electrode, disposing the substrate such that the intermediate layer is located underneath the substrate with respect to a direction of gravity, forming an opening in the intermediate layer by irradiating the intermediate layer with a laser beam from underneath the intermediate layer to remove the intermediate layer on the bus electrode such that at least a portion of the bus electrode is exposed, and forming an opposite electrode corresponding to the pixel electrode and the bus electrode such that the opposite electrode contacts the bus electrode via the opening in the intermediate layer.

Forming the opening may include emitting the laser beam from a laser source such that the laser beam reaches the intermediate layer after being reflected from a polygon mirror. The laser beam may be irradiated onto a predetermined portion of the intermediate layer as the polygon mirror is rotated.

Forming the opening may include irradiating the predetermined portion of the intermediate layer with the laser beam as the laser beam is discontinuously emitted from the laser source.

Forming the opening may be performed by irradiating predetermined portions of the intermediate layer with the discontinuously emitted laser beam while the polygon mirror is being rotated.

The substrate may include a major axis and a minor axis. Forming the opening may include forming a plurality of openings in the intermediate layer along any one of the major axis and the minor axis of the substrate while the polygon mirror is being rotated.

Embodiments are also directed to a method of manufacturing an organic light-emitting display apparatus, including forming a bus electrode, forming an insulating layer to cover the bus electrode, forming a pixel electrode on the insulating layer, forming a pixel-defining layer on the insulating layer such that a portion of the pixel electrode including a center of the pixel electrode is exposed, forming an intermediate layer on the pixel-defining layer and the pixel electrode, forming an opening in the intermediate layer by irradiating the intermediate layer with a laser beam from underneath the intermediate layer to remove the intermediate layer and the insulating layer on the bus electrode such that at least a portion of the bus electrode is exposed, and forming an opposite electrode corresponding to the pixel electrode and the bus electrode such that the opposite electrode contacts the bus electrode.

Forming the bus electrode may include forming the bus electrode on a same layer as any one of a source electrode, a drain electrode, and a gate electrode of a thin film transistor (TFT).

Forming the opening may include emitting the laser beam from a laser source such that the laser beam reaches the intermediate layer after being reflected from a polygon mirror. A predetermined portion of the intermediate layer may be irradiated with the laser beam as the polygon mirror is rotated.

Forming the opening may include irradiating the predetermined portion of the intermediate layer with the laser beam as the laser beam is discontinuously emitted from the laser source.

Forming the opening may be performed by irradiating predetermined portions of the intermediate layer with the discontinuously emitted laser beam while the polygon mirror is being rotated.

The substrate may include a major axis and a minor axis. Forming the opening may include forming a plurality of openings in the intermediate layer along any one of the major axis and the minor axis of the substrate while the polygon mirror is being rotated.

Embodiments are also directed to a method of manufacturing an organic light-emitting display apparatus including forming a bus electrode, forming an insulating layer on the bus electrode such that the bus electrode is exposed by a bus electrode hole formed in the insulating layer, forming a pixel electrode on the insulating layer, forming a pixel-defining layer on the insulating layer such that at least a portion of the bus electrode exposed via the bus electrode hole continues to be exposed, and such that at least a portion of the pixel electrode including a center of the pixel electrode is exposed, forming an intermediate layer on the pixel-defining layer, the pixel electrode, and the bus electrode, forming an opening in the intermediate layer by irradiating the intermediate layer with a laser beam from underneath the intermediate layer to remove the intermediate layer on the bus electrode such that at least a portion of the bus electrode is exposed, and forming an opposite electrode corresponding to the pixel electrode and the bus electrode such that the opposite electrode contacts the bus electrode.

Forming the bus electrode may include forming the bus electrode on a same layer as any one of a source electrode, a drain electrode, and a gate electrode of a thin film transistor (TFT).

Forming the at least one opening may include emitting the laser beam from a laser source such that the laser beam reaches the intermediate layer after being reflected from a polygon mirror. A predetermined portion of the intermediate layer may be irradiated with the laser beam as the polygon mirror is rotated.

Forming the opening may include irradiating the predetermined portion of the intermediate layer with the laser beam as the laser beam is discontinuously emitted from the laser source.

Forming the opening may be performed by irradiating predetermined portions of the intermediate layer with the discontinuously emitted laser beam while the polygon mirror is being rotated.

The substrate may include a major axis and a minor axis. Forming the at least one opening may include forming a plurality of openings in the intermediate layer along any one of the major axis and the minor axis of the substrate while the polygon mirror is being rotated.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
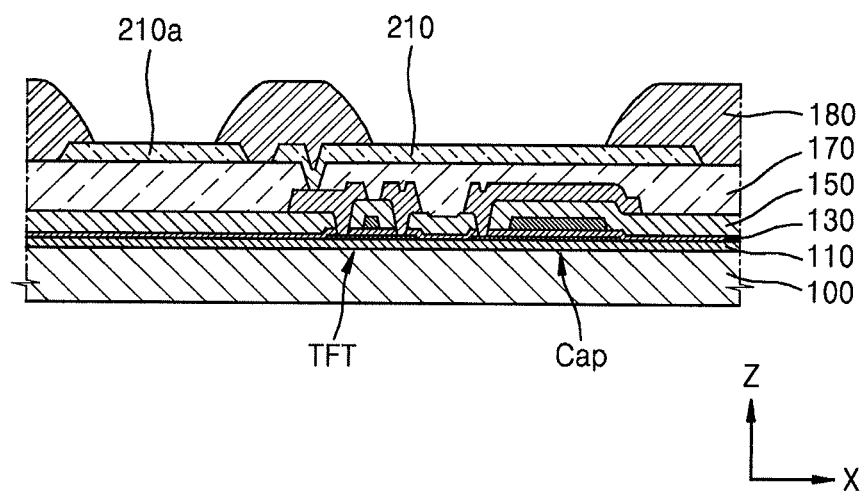
FIGS. 1 to 5, 7, and 8 illustrate schematic cross-sectional views of stages of a method of manufacturing an organic light-emitting display apparatus, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIGS. 1 to 5, 7, and 8 illustrate schematic cross-sectional views of stages of a method of manufacturing an organic light-emitting display apparatus, according to an exemplary embodiment.

As shown in FIG. 1, a pixel electrode 210 and bus electrodes 210a may be formed on a same layer on a substrate 100 and may be spaced apart and electrically insulated from each other. For example, in FIG. 1, the pixel electrode 210 and the bus electrodes 210a are shown as being formed on a planarization layer 170. (In the cross-sectional views illustrated in FIGS. 1 to 5, 7, and 8, the bus electrodes appear as a single bus electrode 210a.)

Various layers may be formed before the pixel electrode 210 and the bus electrodes 210a are formed. In the attached drawings, after a thin film transistor (TFT) and a capacitor Cap are formed on a substrate 100, and after the planarization layer 170 which covers the TFT and the capacitor Cap is formed, the pixel electrode 210 and the bus electrodes 210a may be formed on a planarization layer 170.

The substrate 100 may be formed of glass, metal, plastic such as polyethylene terephthalate (PET), polyethylene naphthalate (PEN), or polyimide, or the like. On the substrate 100, a buffer layer 110 configured to prevent impurities from penetrating a semiconductor layer of the TFT, a gate insulating layer 130 configured to insulate the semiconductor layer of the TFT and a gate electrode from each other, an interlayer insulating layer 150 configured to insulate source/drain electrodes and the gate electrode from each other, the planarization layer 170, which covers the TFT and has generally flat upper surface, or the like, may be formed.

When the pixel electrode 210 and the bus electrodes 210a are formed on the same layer, the pixel electrode 210 and the bus electrodes 210a may be transparent (translucent) electrodes or reflective electrodes. When the pixel electrode 210 and the bus electrodes 210a are transparent (translucent) electrodes, the pixel electrode 210 and the bus electrodes 210a may be formed of, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 210 and the bus electrodes 210a are reflective electrodes, a reflective layer may be formed of silver (Ag), magnesium (Mg), aluminum (Al), platinum (Pt), palladium (Pd), gold (Au), nickel (Ni), neodymium (Nd), iridium (Ir), chromium (Cr), or combinations thereof, and then a layer formed of ITO, IZO, ZnO, or $In_2O_3$ may be formed on the reflective layer. The pixel electrode 210 and the bus electrodes 210a may be simultaneously formed of the same material.

A pixel-defining layer 180 may be formed on the same layer as the pixel electrode 210 and the bus electrodes 210a and may partially cover the pixel electrode 210 and the bus electrode such that at least a portion of the pixel electrode 210, which includes the center thereof, and at least a portion of each of the bus electrodes 210a, are exposed. The pixel-defining layer 180 may define pixels by including openings respectively corresponding to sub-pixels, that is, openings that expose at least a portion of the pixel electrode 210 which includes the center thereof. Also, the pixel-defining layer 180 may increase a distance between an end portion of the pixel electrode 210 and an opposite electrode to be formed on an upper surface of the pixel electrode 210 and may prevent electric arcs from occurring at the end portion of the pixel electrode 210.

Figure 2:
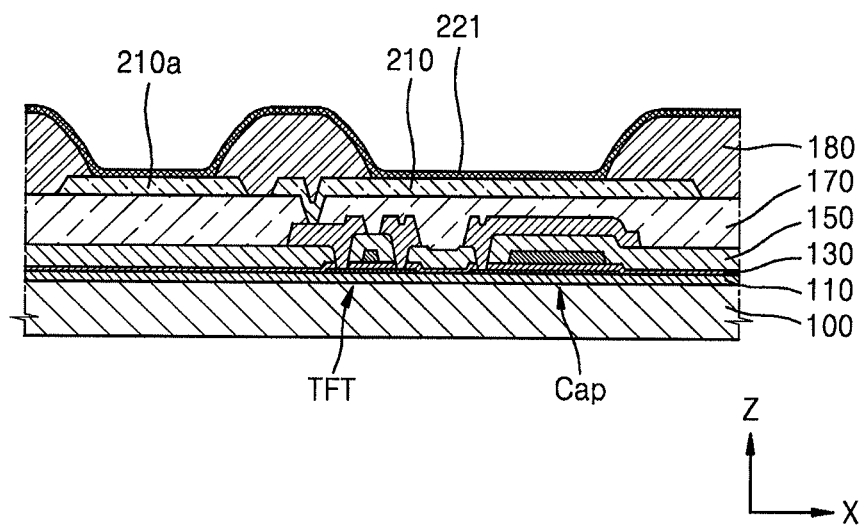

As shown in FIG. 2, a first intermediate layer 221 may be formed on an upper surface of the pixel-defining layer 180 disposed between the pixel electrode 210 and the bus electrodes 210a and on an upper surface of each of the pixel electrode 210 and the bus electrodes 210a. The first intermediate layer 221 may be a single layer formed on a plurality of pixels.

The first intermediate layer 221 may have a single-layer structure or multilayer structure. For example, if the first intermediate layer 221 is formed of a polymer material, the first intermediate layer 221 may be formed of poly-(3,4)-ethylene-dihydroxy thiophene (PEDOT) or polyaniline (PANI), providing a hole transport layer (HTL) having a single-layer structure. If the first intermediate layer 221 is formed of a low molecular material, the first intermediate layer 221 may have a multilayer structure including a hole injection layer (HIL) and an HTL.

Figure 3:
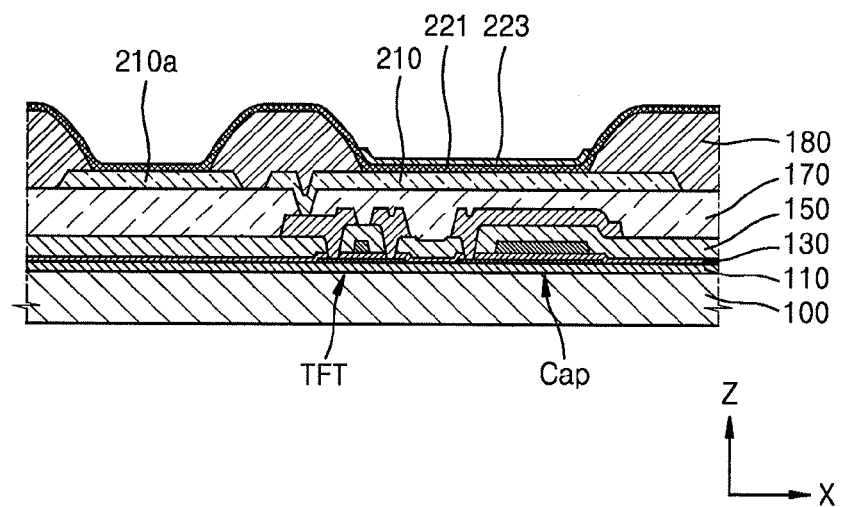

As shown in FIG. 3, an emission layer 223 may be formed on the first intermediate layer 221 so as to correspond to the pixel electrode 210.

Figure 4:
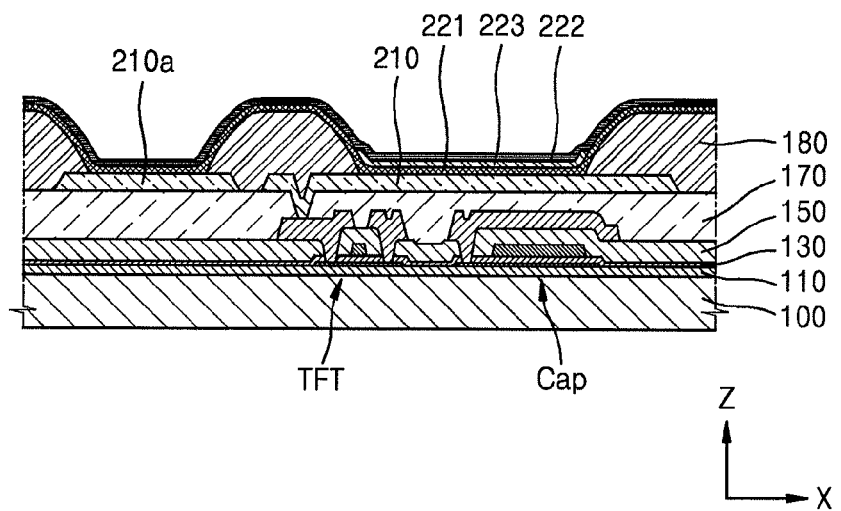

As shown in FIG. 4, a second intermediate layer 222 may be formed to cover the first intermediate layer 221 and the emission layer 223. In some implementations, the second intermediate layer 222 may be omitted. For example, when the first intermediate layer 221 and the emission layer 223 are formed of polymer materials, the second intermediate layer 222 may be omitted. When the first intermediate layer 221 and the emission layer 223 are formed of low molecular materials, it may be advantageous to form the second intermediate layer 222 in order to improve characteristics of an organic light-emitting device. In this case, the second intermediate layer 222 may have a single-layer structure or multilayer structure and may include an electron transport layer (ETL) and/or an electron injection layer (EIL).

The first intermediate layer 221, the emission layer 223, and/or the second intermediate layer 222 may be collectively referred to as an intermediate layer. A process of forming the first intermediate layer 221, a process of forming the emission layer 223 and/or a process of forming the second intermediate layer 222 may be understood as a process of forming an intermediate layer.

Figure 5:
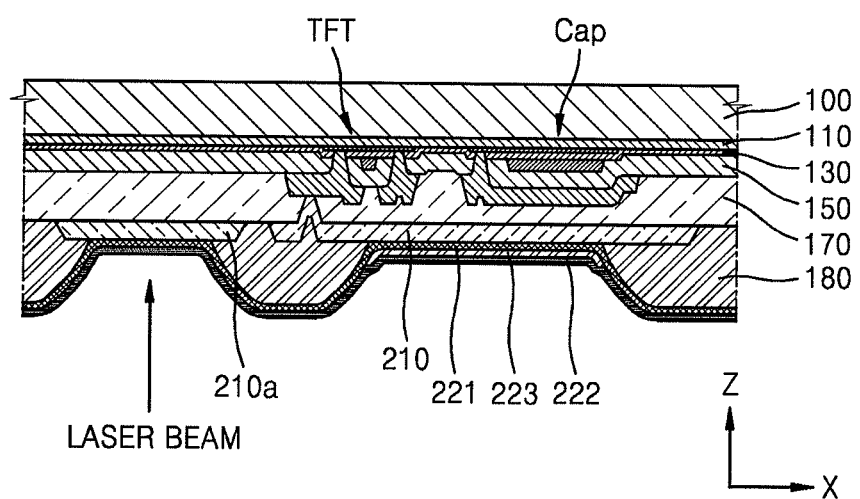

As shown in FIG. 5, the intermediate layer may be arranged or oriented to face a downward direction such that the intermediate layer is disposed under the substrate 100. Herein, terms such as "downward," "under," and "underneath" may be understood with respect to a direction of gravity. When the intermediate layer is disposed under the substrate 100, an opening may be formed by irradiating the intermediate layer with a laser beam in a Z direction from underneath the intermediate layer and then removing a portion of the intermediate layer covering each of the bus electrodes 210a so as to expose at least a portion of each of the bus electrodes 210a. The intermediate layer may be irradiated with the laser beam when the intermediate layer is arranged lower than the substrate 100 in order to prevent particles that may be generated when a portion of the intermediate layer is removed by the laser beam from being located on the intermediate layer. For example, the intermediate layer is arranged lower than the substrate 100, generated particles may be pulled away from the intermediate layer by the force of gravity. If the intermediate layer were to be irradiated with the laser beam in a Z direction from the top of the organic light-emitting display apparatus when the intermediate layer is arranged to be higher than the substrate 100, the particles that may be generated when a portion of the intermediate layer is removed by the laser beam could become located on the intermediate layer. If the particles were to become located on an area corresponding to the pixel electrode 210 of the intermediate layer, pixels formed by the pixel electrode 210 could exhibit defects, and thus, the organic light-emitting display apparatus could have black spots.

When the pixel electrode 210 and the bus electrodes 210a are formed on the same layer, the bus electrodes 210a may be disposed at a plurality of locations of a display area of the organic light-emitting display apparatus. When a portion of the intermediate layer is removed by irradiating the intermediate layer with the laser beam, it is desirable to irradiate a plurality of locations corresponding to the bus electrodes 210a with the laser beam. When openings corresponding to the bus electrodes 210a are formed, the laser beam may be discontinuously emitted from a laser source, and a predetermined portion of the intermediate layer may be irradiated with the emitted laser beam.

Figure 6:
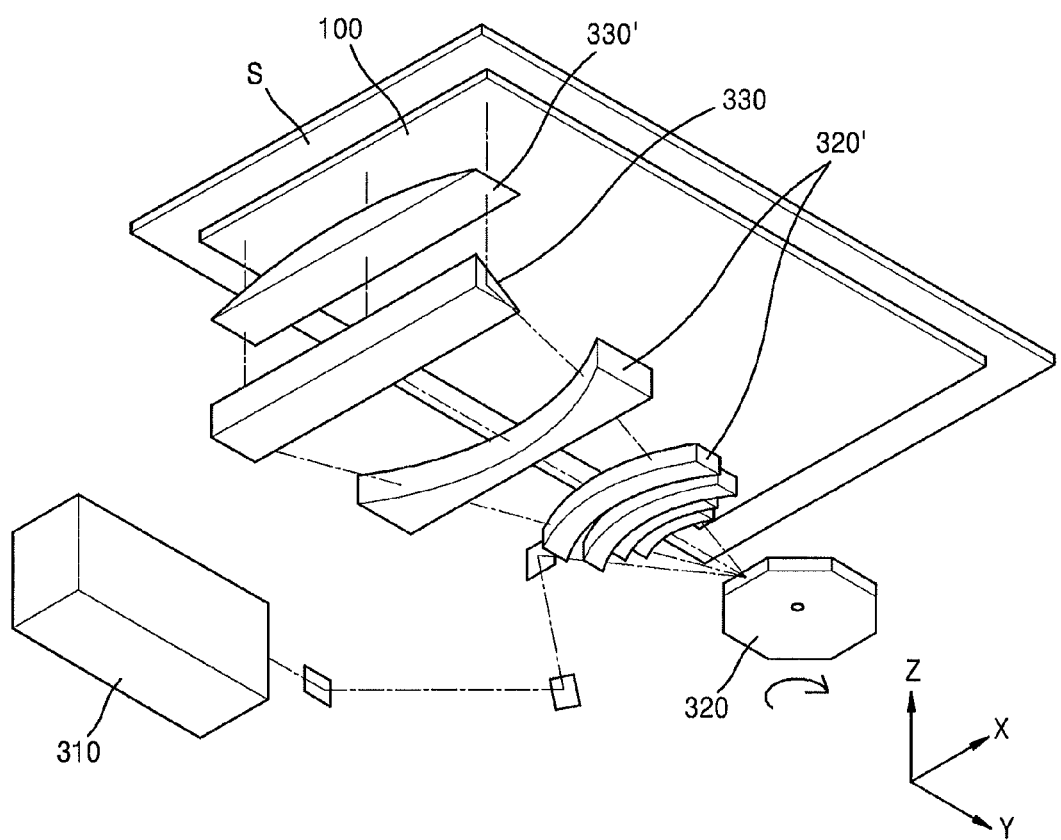
FIG. 6 illustrates a schematic perspective view of a laser emitting device for emitting a laser beam as shown in FIG. 5.

FIG. 6 illustrates a schematic perspective view of a laser emitting device that may be used to emit a laser beam as shown in FIG. 5. As shown in FIG. 6, the laser beam emitted from a laser source 310 may be reflected from a polygon mirror 320 and to reach the intermediate layer on the substrate 100. IA predetermined portion of the intermediate layer may be irradiated with the laser beam by rotating the polygon mirror 320. A surface (an XY plane) that is roughly parallel to the substrate 100 may be irradiated with the laser beam reflected from the polygon mirror 320, and after being reflected from a reflector 330, the laser beam may be emitted in a direction (a +Z direction) that is roughly vertical to the substrate 100. The polygon mirror 320 may rotate about an axis (a Z axis) that is roughly vertical to the substrate 100. According to a rotation degree of the polygon mirror 320, locations irradiated with the laser beam may be changed.

As shown in FIG. 6, the substrate 100 may have a major axis (a Y-axis direction) and a minor axis (an X-axis direction). When forming openings in the intermediate layer, the polygon mirror 320 may rotate, and the openings may be formed in the intermediate layer along any one of the major axis and the minor axis. The polygon mirror 320 may have a plurality of reflection planes along the circumference of the polygon mirror 320. Accordingly, the openings may be formed in the intermediate layer along any one of the major axis and the minor axis by adjusting an incidence angle of the laser beam on one reflection plane.

As shown in FIG. 6, when the openings are formed in the intermediate layer along the minor axis (an X axis) of the substrate 100 by adjusting an incidence angle of the laser beam on one reflection plane of the polygon mirror 320, a location of the substrate 100 may be adjusted along the major axis (a Y axis) via a stage S, and then openings may be formed in the intermediate layer along the minor axis (the X axis) of the substrate 100 by using another reflection plane of the polygon mirror 320. As described above, openings may be formed over an entire area of the intermediate layer disposed on the substrate 100 by rotating the polygon mirror 320. For example, when openings are formed in the intermediate layer along the minor axis (the X axis) of substrate 100, predetermined areas of the intermediate layer may be irradiated with the laser beam by rotating the polygon mirror 320 whenever the laser beam is discontinuously emitted.

As shown in FIG. 6, which is a schematic perspective view of the laser emitting device used to emit the laser beam, other optical elements 320' and 330' may be arranged between the polygon mirror 320 and the reflector 330 or between the reflector 330 and the substrate 100.

Figure 7:
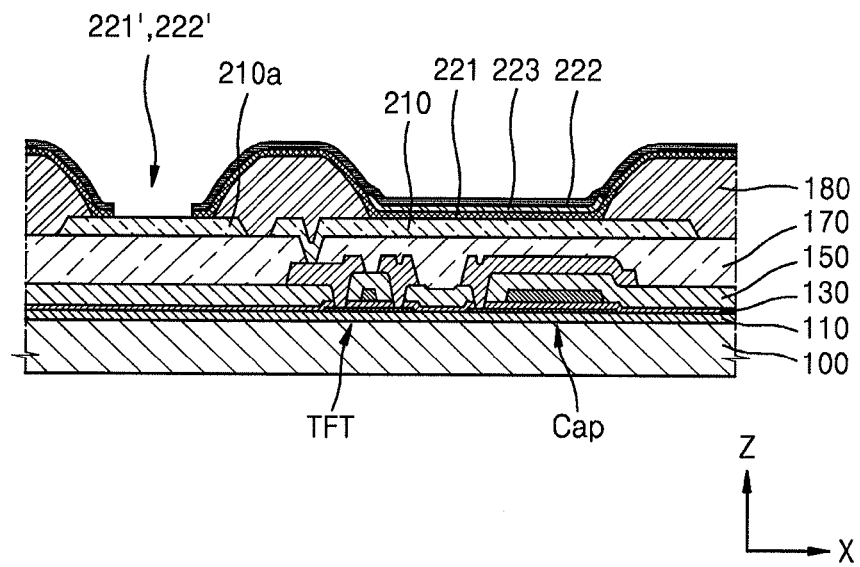

As shown in FIG. 7, at least a portion of the bus electrodes 210a may be exposed by forming a first opening 221' in the first intermediate layer 221 and a second opening 222' in the second intermediate layer 222 after a portion of an upper surface of the bus electrode 210a, which corresponds to the first intermediate layer 221, and a portion of an upper surface of the bus electrode 210a, which corresponds to the second intermediate layer 222, are removed.

Figure 8:
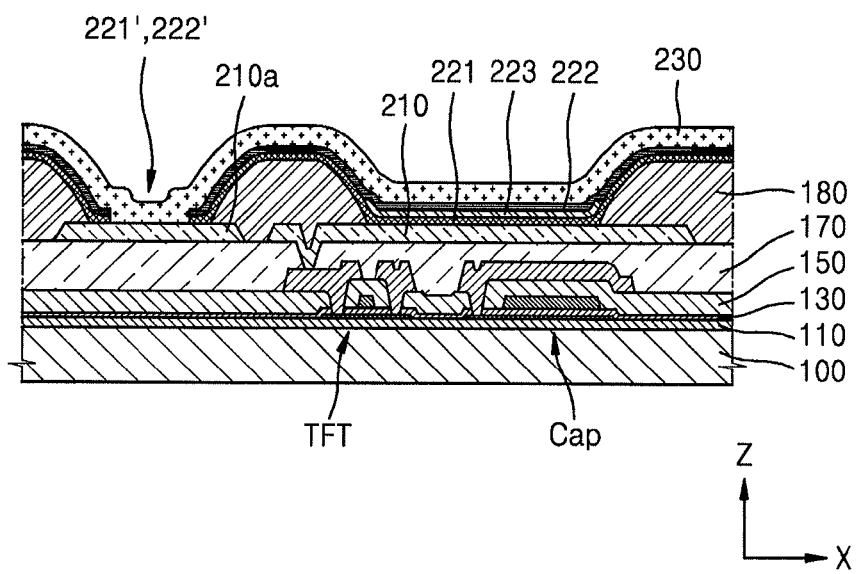

As shown in FIG. 8, an opposite electrode 230, which corresponds to the pixel electrode 210 and the bus electrodes 210a, may be formed to contact the bus electrodes 210a via the first opening 221' of the first intermediate layer 221 and the second opening 222' of the second intermediate layer 222. The opposite electrode 230 may be integrally formed on pixels and may cover the display area (an active area). The term "display area" refers to an entire area of the organic light-emitting display apparatus where light may be emitted. For example, the term "display area" may refer to an entire area of the organic light-emitting display apparatus where a controller, etc. are disposed, except for edges of the organic light-emitting display apparatus. When there is no dead area on an entire surface of the organic light-emitting display apparatus, the entire surface may be the display area.

The opposite electrode 230 may contact an electrode power supply line arranged on an outer region of the display area and may receive electrical signals from the electrode power supply line. The opposite electrode 230 may be a transparent (translucent) electrode or a reflective electrode. When the opposite electrode 230 is a transparent (translucent) electrode, a layer formed of Li, Ca, LiF/Ca, LiF/Al, Al, Mg, or a combination thereof may be formed, and then another layer formed of a transparent (translucent) material such as ITO, IZO, ZnO, or $In_2O_3$ may be formed on the layer so as to form the transparent (translucent) electrode. When the opposite electrode 230 is a reflective electrode, a layer containing at least one material selected from the group of Li, Ca, LiF/Ca, LiF/Al, Al, Ag, and Mg may be formed to form the reflective electrode. In other implementations, the opposite electrode 230 may be formed of other materials and may have other structures such as a multilayer structure.

According to the method of manufacturing the organic light-emitting display apparatus of the present embodiment, the bus electrodes 210a may be formed, and the opposite electrode 230 may contact the bus electrodes 210a. Thus, electrical signals may be transmitted via the bus electrodes 210a having high electric conductivity, and IR drops in the opposite electrode 230, which could occur if the bus electrodes 210a were not present, may not occur or may be minimized. As a result, the unintended occurrence of brightness deviation of pixels may be prevented, or the brightness deviation of the pixels may be minimized when it occurs.

As shown in FIG. 8, in order for the opposite electrode 230 to contact the bus electrodes 210a, it is desirable to prevent at least a portion of the bus electrodes 210a from being covered by the first intermediate layer 221 and the second intermediate layer 222. If, when the first intermediate layer 221 and the second intermediate layer 222 are initially formed the first intermediate layer 221 and the second intermediate layer 222 were to be formed to not cover portion of the bus electrodes 210a, a mask may be required to form the first intermediate layer 221 and the second intermediate layer 222. Thus, a manufacturing procedure may become complicated because an additional process, for example, a process of accurately aligning the substrate 100 and the mask, may need to be performed.

However, according to the method of manufacturing the organic light-emitting display apparatus of the present embodiment, the first intermediate layer 221 and the second intermediate layer 222 are formed on, for example, an entire surface of the substrate 100, and portions of the first intermediate layer 221 and the second intermediate layer 222 that are disposed on at least a portion of the bus electrodes 210a may be selectively removed by the laser beam. Therefore, a manufacturing efficiency may be greatly improved.

Figure 9:
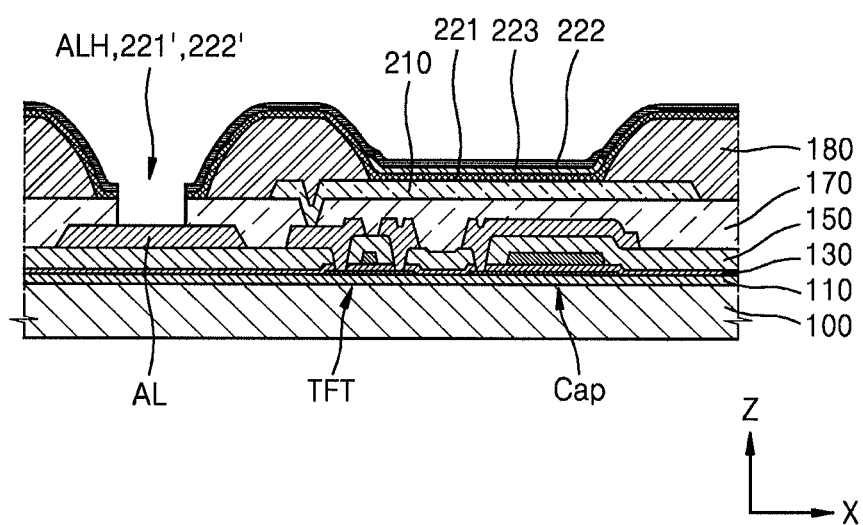
FIG. 9 illustrates a schematic cross-sectional view of one stage of a method of manufacturing an organic light-emitting display apparatus, according to another exemplary embodiment.

FIGS. 1 to 5, 7, and 8 illustrate a case where the bus electrodes 210a and the pixel electrode 210 are formed on the same layer. In another exemplary embodiment, the bus electrodes 210a may be formed on the same layer as an electrode of the TFT. Hereinafter, a case where the bus electrodes 210a are formed on the same layer as an electrode of the TFT will be described. FIG. 9 is a schematic cross-sectional view of one process of a method of manufacturing an organic light-emitting display apparatus, according to this exemplary embodiment.

Bus electrodes AL may be formed on a substrate 100, and a planarization layer 170, which is an insulating layer and covers the bus electrodes AL, may be formed. After a pixel electrode 210 is formed on the planarization layer 170, a pixel-defining layer 180 may be formed on the planarization layer 170 in order to expose at least a portion of the pixel electrode 210 that includes the center thereof. In this case, the pixel-defining layer 180 may be formed on the planarization layer 170 in order to expose at least a portion of areas of the planarization layer 170 that correspond to the bus electrodes AL. FIG. 9 illustrates a planarization layer 170, but in other implementations, another type of insulating layer, such as a protective layer that has an even surface or uneven surface may be formed.

When the bus electrodes AL are formed, the bus electrodes AL may be formed on the same layer as any one of a source electrode, a drain electrode, and a gate electrode of the TFT. FIG. 9 shows that the bus electrodes AL are formed on the same layer as the source electrode and the drain electrode of the TFT, that is, on an interlayer insulating layer 150. The bus electrodes AL and the source and drain electrodes of the TFT may be simultaneously formed of the same material.

A first intermediate layer 221 may be formed on the pixel-defining layer 180 and the pixel electrode 210, and an emission layer 223 may be formed on the first intermediate layer 221 such that the emission layer 223 may contact the pixel electrode 210. The second intermediate layer 222 may be omitted. For example, when the first intermediate layer 221 and the emission layer 223 are formed of polymer materials, the second intermediate layer 222 may be formed omitted. When the first intermediate layer 221 and the emission layer 223 are formed of low molecular materials, it may be advantageous to form the second intermediate layer 222 in order to improve characteristics of the organic light-emitting device.

As shown in FIG. 9, at least a portion of the bus electrodes AL may be exposed. The exposure may be made by removing a portion of the planarization layer 170, which is disposed on one of the bus electrodes AL, and a portion of the first intermediate layer 221, which is disposed on another one of the bus electrodes AL, and by forming a bus electrode hole ALH and a first opening 221' of the first intermediate layer 221. If the second intermediate layer 222 is present, as shown in FIG. 9, a second opening 222' of the second intermediate layer 222 may also be formed.

The exposure of at least a portion of the bus electrodes AL may be made by irradiating the first intermediate layer 221 or the second intermediate layer 222 with the laser beam by using the device shown in FIG. 6. That is, the bus electrode hole ALH, the first opening 221', and the second opening 222' may be simultaneously formed by being irradiated with the laser beam. In this case, the laser beam may be emitted toward the intermediate layer when the intermediate layer is arranged or oriented lower than the substrate 100, in a similar manner as shown in FIG. 5. Thus, particles that may be generated while the bus electrode hole ALH, the first opening 221', and the second opening 222' are formed may be prevented from being located on the intermediate layer. Then, the opposite electrode 230 corresponding to the pixel electrode 210 and the bus electrodes AL may be formed to contact the bus electrodes AL via the bus electrode hole ALH, the first opening 221', and the second opening 222', in a similar manner as shown in FIG. 8.

According to a method of manufacturing an organic light-emitting display apparatus according to this exemplary embodiment, the planarization layer 170, which is an insulating layer, may be formed to cover the bus electrodes AL such that the bus electrode hole ALH may be formed. For example, after the planarization layer 170 is formed, the bus electrode hole ALH, which exposes at least a portion of the bus electrodes AL, may be formed by removing at least a portion of areas of the planarization layer 170 corresponding to the bus electrodes AL. In this case, the bus electrode hole ALH may be simultaneously formed with a contact hole in the planarization layer 170. The contact hole may be formed in order to expose a portion of the source or drain electrode of the TFT that is to be electrically connected to the pixel electrode 210.

The pixel electrode 210, which is electrically connected to the TFT via the contact hole, may be formed, and the pixel-defining layer 180, which exposes at least a central portion of the pixel electrode 210, may be formed on the planarization layer 170. As shown in FIG. 9, the pixel-defining layer 180 may be formed to expose at least a portion of the portions exposed by the bus electrode hole ALH of the bus electrodes AL.

Then, the first intermediate layer 221 may be formed on the pixel-defining layer 180, the pixel electrode 210, and the bus electrodes AL, and the emission layer 223 may be formed. As desired, the second intermediate layer 222 may be formed. The first opening 221' may be formed by removing a portion of the first intermediate layer 221 that is disposed on the bus electrodes AL, and as shown in FIG. 9, at least a portion of the bus electrodes AL is exposed. If the second intermediate layer 222 is present, the second opening 222' may be formed by removing a portion of the second intermediate layer 222 that is disposed on the bus electrodes AL, and thus, at least a portion of the bus electrodes AL is exposed. The first opening 221' may be formed by irradiating the first intermediate layer 221 with the laser beam, and if the second opening 222' is to be formed, the first opening 221' and the second opening 222' may be simultaneously formed by irradiating the first intermediate layer 221 with the laser beam. The opposite electrode 230 corresponding to the pixel electrode 210 and the bus electrodes AL may be formed to contact the bus electrodes AL via the bus electrode hole ALH, the first opening 221', and the second opening 222'.

By way of summation and review, In a general organic light-emitting display apparatus, an IR drop may occur in an opposite electrode integrally formed on across pixels, and a pixel brightness deviation, may unintentionally occur.

Embodiments provide a method of easily manufacturing an organic light-emitting display apparatus having excellent emission stability.

As described above, according to the one or more of the above exemplary embodiments, a method of easily manufacturing an organic light-emitting display apparatus having good emission stability may be embodied.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of manufacturing an organic light-emitting display apparatus, the method comprising:
   forming a pixel electrode and a bus electrode on a same layer on a substrate, the pixel electrode and the bus electrode being spaced apart and electrically insulated from each other;
   forming a pixel-defining layer on the same layer and on the pixel electrode and the bus electrode such that at least a portion of the pixel electrode including a center of the pixel electrode and at least a portion of the bus electrode are exposed;
   forming an intermediate layer on an upper surface of the pixel-defining layer disposed between the pixel electrode and the bus electrode, and on the pixel electrode and the bus electrode;
   orienting the substrate such that the intermediate layer is located underneath the substrate with respect to a direction of gravity;
   forming an opening in the intermediate layer by irradiating the intermediate layer with a laser beam from underneath the intermediate layer to remove the intermediate layer on the bus electrode such that at least a portion of the bus electrode is exposed; and
   forming an opposite electrode corresponding to the pixel electrode and the bus electrode such that the opposite electrode contacts the bus electrode via the opening in the intermediate layer.

2. The method as claimed in claim 1, wherein:
   forming the opening includes emitting the laser beam from a laser source such that the laser beam reaches the intermediate layer after being reflected from a polygon mirror, and
   the laser beam is irradiated onto a predetermined portion of the intermediate layer as the polygon mirror is rotated.

3. The method as claimed in claim 2, wherein forming the opening includes irradiating the predetermined portion of the intermediate layer with the laser beam as the laser beam is discontinuously emitted from the laser source.

4. The method as claimed in claim 3, wherein forming the opening is performed by irradiating predetermined portions of the intermediate layer with the discontinuously emitted laser beam while the polygon mirror is being rotated.

5. The method as claimed in claim 2, wherein:
   the substrate includes a major axis and a minor axis, and
   forming the opening includes forming a plurality of openings in the intermediate layer along any one of the major axis and the minor axis of the substrate while the polygon mirror is being rotated.

6. A method of manufacturing an organic light-emitting display apparatus, the method comprising:
   forming a bus electrode on a substrate;

forming an insulating layer to cover the bus electrode;
forming a pixel electrode on the insulating layer;
forming a pixel-defining layer on the insulating layer such that a portion of the pixel electrode including a center of the pixel electrode is exposed;
forming an intermediate layer on the pixel-defining layer and the pixel electrode;
orienting the substrate such that the intermediate layer is located underneath the substrate with respect to a direction of gravity;
forming an opening in the intermediate layer by irradiating the intermediate layer with a laser beam from underneath the intermediate layer to remove the intermediate layer and the insulating layer on the bus electrode such that at least a portion of the bus electrode is exposed and such that particles generated in forming the opening in the intermediate layer fall away from the substrate by force of gravity; and
forming an opposite electrode corresponding to the pixel electrode and the bus electrode such that the opposite electrode contacts the bus electrode.

7. The method as claimed in claim 6, wherein forming the bus electrode includes forming the bus electrode on a same layer as any one of a source electrode, a drain electrode, and a gate electrode of a thin film transistor (TFT).

8. The method as claimed in claim 6, wherein:
forming the opening includes emitting the laser beam from a laser source such that the laser beam reaches the intermediate layer after being reflected from a polygon mirror, and
a predetermined portion of the intermediate layer is irradiated with the laser beam as the polygon mirror is rotated.

9. The method as claimed in claim 8, wherein forming the opening includes irradiating the predetermined portion of the intermediate layer with the laser beam as the laser beam is discontinuously emitted from the laser source.

10. The method as claimed in claim 9, wherein forming the opening is performed by irradiating predetermined portions of the intermediate layer with the discontinuously emitted laser beam while the polygon mirror is being rotated.

11. The method as claimed in claim 8, wherein:
the substrate includes a major axis and a minor axis, and
forming the opening includes forming a plurality of openings in the intermediate layer along any one of the major axis and the minor axis of the substrate while the polygon mirror is being rotated.

12. A method of manufacturing an organic light-emitting display apparatus, the method comprising:
forming a bus electrode on a substrate;
forming an insulating layer on the substrate and on the bus electrode such that the bus electrode is exposed by a bus electrode hole formed in the insulating layer;
forming a pixel electrode on the insulating layer;
forming a pixel-defining layer on the insulating layer such that at least a portion of the bus electrode exposed via the bus electrode hole continues to be exposed, and such that at least a portion of the pixel electrode including a center of the pixel electrode is exposed;
forming an intermediate layer on the pixel-defining layer, the pixel electrode, and the bus electrode;
orienting the substrate such that the intermediate layer is located underneath the substrate with respect to a direction of gravity;
forming an opening in the intermediate layer by irradiating the intermediate layer with a laser beam from underneath the intermediate layer to remove the intermediate layer on the bus electrode such that at least a portion of the bus electrode is exposed and such that particles generated in forming the opening in the intermediate layer fall away from the substrate by force of gravity; and
forming an opposite electrode corresponding to the pixel electrode and the bus electrode such that the opposite electrode contacts the bus electrode.

13. The method as claimed in claim 12, wherein forming the bus electrode includes forming the bus electrode on a same layer as any one of a source electrode, a drain electrode, and a gate electrode of a thin film transistor (TFT).

14. The method as claimed in claim 12, wherein:
forming the at least one opening includes emitting the laser beam from a laser source such that the laser beam reaches the intermediate layer after being reflected from a polygon mirror, and
a predetermined portion of the intermediate layer is irradiated with the laser beam as the polygon mirror is rotated.

15. The method as claimed in claim 14, wherein forming the opening includes irradiating the predetermined portion of the intermediate layer with the laser beam as the laser beam is discontinuously emitted from the laser source.

16. The method as claimed in claim 15, wherein forming the opening is performed by irradiating predetermined portions of the intermediate layer with the discontinuously emitted laser beam while the polygon mirror is being rotated.

17. The method as claimed in claim 14, wherein:
the substrate includes a major axis and a minor axis, and
forming the at least one opening includes forming a plurality of openings in the intermediate layer along any one of the major axis and the minor axis of the substrate while the polygon mirror is being rotated.

* * * * *